(12) United States Patent
Felici et al.

(10) Patent No.: US 6,768,327 B2
(45) Date of Patent: Jul. 27, 2004

(54) TESTING HEAD HAVING VERTICAL PROBES FOR SEMICONDUCTOR INTEGRATED ELECTRONIC DEVICES

(75) Inventors: Stefano Felici, Robbiate (IT); Giuseppe Crippa, Merate (IT)

(73) Assignee: Technoprobe S.r.l., Cernusco Lombardone (IL)

( * ) Notice: Subject to any disclaimer, the term of this patent is extended or adjusted under 35 U.S.C. 154(b) by 0 days.

(21) Appl. No.: 10/102,449

(22) Filed: Mar. 19, 2002

(65) Prior Publication Data

US 2002/0153910 A1 Oct. 24, 2002

(30) Foreign Application Priority Data

Mar. 19, 2001 (IT) ........................ MI2001A0567

(51) Int. Cl.[7] .............................................. G01R 31/02
(52) U.S. Cl. ........................... 324/754; 324/72.5
(58) Field of Search ............................. 324/754, 758, 324/761, 763, 72.5, 158.1; 439/482, 66

(56) References Cited

U.S. PATENT DOCUMENTS

| | | | | |
|---|---|---|---|---|
| 4,774,462 A | * | 9/1988 | Black | 324/758 |
| 4,963,822 A | * | 10/1990 | Prokopp | 324/758 |
| 5,320,559 A | * | 6/1994 | Uratsuji et al. | 439/482 |
| 5,952,843 A | * | 9/1999 | Vinh | 324/761 |
| 6,242,929 B1 | * | 6/2001 | Mizuta | 324/754 |
| 6,462,575 B1 | * | 10/2002 | Cram | 324/765 |
| 6,515,496 B2 | * | 2/2003 | Felici et al. | 324/754 |

FOREIGN PATENT DOCUMENTS

IT    1243931 A1 * 9/2002 ........... G01R/1/073

* cited by examiner

*Primary Examiner*—David A. Zarneke
*Assistant Examiner*—Jermele Hollington
(74) *Attorney, Agent, or Firm*—Seed IP Law Group PLLC

(57) ABSTRACT

A testing head having vertical probes is presented. The testing head a first and a second plate-like holder provided with respective guide holes, a contact probe adapted to be received in the guide holes and having a contact tip adapted to establish mechanical and electrical contact to a corresponding contact pad of an integrated electronic device to be tested, the contact probe being deformed in a deflection region located between the plate-like holders as the contact tip abuts onto the contact pad. The contact probe further comprises a rigid arm extending laterally from a body of the contact probe and terminating in the contact tip, the rigid arm being adapted to offset the contact point of the contact probe with the corresponding contact pad with respect to a longitudinal axis of the contact probe.

48 Claims, 11 Drawing Sheets

TESTING HEAD HAVING VERTICAL PROBES FOR SEMICONDUCTOR INTEGRATED ELECTRONIC DEVICES

BACKGROUND OF THE INVENTION

1. Field of the Invention

The present invention relates to a testing head having vertical probes and used to test a plurality of semiconductor-integrated electronic devices incorporating so called contact pads.

2. Description of the Related Art

As is well known, a testing head is basically a device suitable to electrically interconnect a plurality of contact pads of a semiconductor-integrated electronic device and corresponding channels of a testing machine arranged to perform the tests.

Integrated electronic devices are factory tested in order to spot and reject any circuits that show out to be already defective during the manufacturing phase. The testing heads are normally employed to electrically test the semiconductor-integrated electronic devices "on wafer", before cutting and mounting them in a chip package.

A testing head having vertical probes comprises at least a pair of parallel plate-like holders placed at a given distance apart to leave an air gap therebetween, and a plurality of specially provided movable contact elements.

Each plate holder, referred to as a die in the art and throughout this specification, is formed with a plurality of through-going guide holes, each hole in one of the dies corresponding to a hole in the other die and guiding a respective contact element, or contact probe as the element will be called through this specification and the appended claims, for sliding movement therein. The contact probes are usually cut from wire stock of some special alloy having good electrical and mechanical properties.

A good electrical connection of the testing head contact probes to the contact pads of an integrated electronic device to be tested is achieved by urging each contact probe onto the respective contact pad. This results in the movable contact probes becoming flexed in the air gap between the two dies.

Testing heads of this type are commonly known as "vertical probes".

Briefly, known testing heads have an air space where the probes are allowed to flex, such a flexion action being eventually assisted by suitable design of the probes or their dies, as shown schematically in FIG. 1.

As shown in FIG. 1, a testing head 1 comprises at least an upper die 2 and a lower die 3, both dies being formed with through-going upper guide hole 4 and lower guide hole 5, respectively, in which at least one contact probe 6 slides.

The contact probe 6 has a contact end or tip 7. In particular, the contact tip 7 is caused to abut against a contact pad 8 of an integrated electronic device to be tested, thereby establishing an electrical contact between said device and a testing apparatus (not shown) that has said testing head as end element.

The upper and lower dies 2 and 3 are suitably separated by an air space 9 in which the contact probes 6 are allowed to deform or flex in normal operation of the testing head, i.e. upon the testing head coming in contact with the integrated electronic device to be tested. The upper and lower guide holes 4 and 5 are both sized to guide the contact probe 6.

FIG. 1 schematically shows a testing head 1, which mounts loose-fitting probes and is associated with a micro-contact strip or space transformer shown schematically at 10.

In this case, each contact probe 6 has another contact tip toward a plurality of contact pads 11 of the space transformer 10. The electric connection of the probes to the space transformer 10 is assured same as the connection to the integrated electronic device to be tested, i.e. by urging the probes 6 onto the contact pads 11 of the space transformer 10.

A major advantage of a testing head 1 with loose-mounted contact probes is that one or more faulty probes 6 in the set of probes, or the whole set, can be replaced more conveniently than in testing heads that have fixed probes.

In this case, however, the upper and lower dies 2 and 3 should be designed to ensure that the contact probes 6 will be held in place even when no integrated electronic device is abutting their contact tips 7 for testing, or when a probe set is removed for replacement purpose.

The deformed pattern of the probes and the force needed to produce the deflection depend on several factors, namely:

the distance between the upper and lower dies;

the physical characteristics of the alloy from which the probes are formed; and the amount of offset between the guide holes in the upper die and the corresponding guide holes in the lower die, as well as the distance between such holes.

It should be noted that, for the testing head to perform properly, the probes should be allowed a suitable degree of free axial movement within the guide holes. In this way, the probes can also be taken out and replaced individually in the event of a single probe breaking, with no need to replace the whole testing head.

All these features are, therefore, to be taken into due account in the manufacture of a testing head, given that a good electric connection between the probes and the device to be tested is mandatory.

Also known is to use contact probes having a pre-deformed shape even when the testing head 1 is not contacting the device to be tested, as in the probes 6b, 6c and 6d shown in FIG. 2A. The pre-deformed shape effectively helps the probe to correctly flex during its operation, i.e. upon contacting the integrated electronic device to be tested.

Conventional testing heads inherently place limits on the distance to be lowered between two adjacent probes 6, while the technological development and the chip miniaturization continuously press to reduce the distance between centers of two contact pads 8 of an integrated electronic device to be tested, this distance being known as the pitch distance of the pads.

Thus, a minimum pitch, in the sense given above, will be dependent on the layout and the dimensions of the probes 6, according to the following relation:

$$\text{Pitchmin} = E + 2A\text{min} + W\text{min}$$

where $A\text{min} = (F-E)/2$ and where, as shown in FIG. 2B, which is a sectional view through part of a testing head 1 according to the prior art:

Pitchmin is the minimum pitch or distance between centers of two adjacent contact pads 8 of the integrated electronic device to be tested;

E is the dimension of the cross-section of the probe 6. For example, in probes having a circular cross-sectional shape, the dimension used for computing the minimum pitch would be the cross-section diameter value of the probe 6, where the probe has a square cross-sectional shape, while in probes having a rectangular cross-sectional shape, the dimension used for computing the minimum pitch would be the minor side or the major side of the rectangular cross-section of the probe 6, depending on the chosen arrangement for positioning the contact probes;

In particular, FIGS. 2C, 2D, 2E and 2F are top plan views of a testing head portion comprising contact probes 6 having a circular cross-sectional shape (FIG. 2C), a square cross-sectional shape (FIG. 2D) and a rectangular cross-sectional shape (FIGS. 2E and 2F, in mirrored configurations) respectively.

Amin is the minimum distance between a probe 6 and its guide holes 4e 5 that allows the probe to slide freely in the guide holes 4, 5 during normal operation of the testing head;

Wmin is the minimum wall thickness allowable between one guide hole 4, 5 and the following, in order to guarantee the testing head 1 to be an adequately strong structure; and F is the dimension of the cross section of a guide hole 4.

Current vertical technologies, usually with circular cross-sectional shaped probes, achieve a reduction of the pitch value by reducing the dimensions, and especially reducing the minimum dimension E (being the minimum diameter for probes having a circular cross section) of the probes 6. The other factors in the above relation are set practically by technological limitations to the manufacture of the testing head.

BRIEF SUMMARY OF THE INVENTION

An embodiment of this invention provides testing heads for microstructures, which comprise probes designed to deform upon coming in touch with contact pads in order to establish a good electric connection to an integrated electronic device to be tested, and adapted to allow a substantial reduction in the distance between contact tips and thus a reduction in the pitch distance between contact pads of integrated electronic devices to be tested.

One of the principles on which an embodiment of the present invention stands is to provide a testing head with a plurality of vertical probes having at least a rigid end portion extending laterally with respect to the contact probe body.

Presented is a testing head having vertical probes and comprising a first and a second plate-like holder provided with respective guide holes a contact probe adapted to be received in the guide holes and having a contact tip adapted to establish mechanical and electrical contact to a corresponding contact pad of an integrated electronic device to be tested, the contact probe being deformed in a deflection region located between the plate-like holders as the contact tip abuts onto the contact pad wherein the contact probe further comprises a rigid arm extending laterally from a body of the contact probe and terminating in the contact tip, the rigid arm being adapted to offset the contact point of the contact probe with the corresponding contact pad with respect to a longitudinal axis of the contact probe.

The features and advantages of the testing head according to this invention will be apparent from the following description of embodiments thereof, given by way of non-limitative examples with reference to the accompanying drawings.

DETAILED DESCRIPTION OF THE INVENTION

Figure 1:
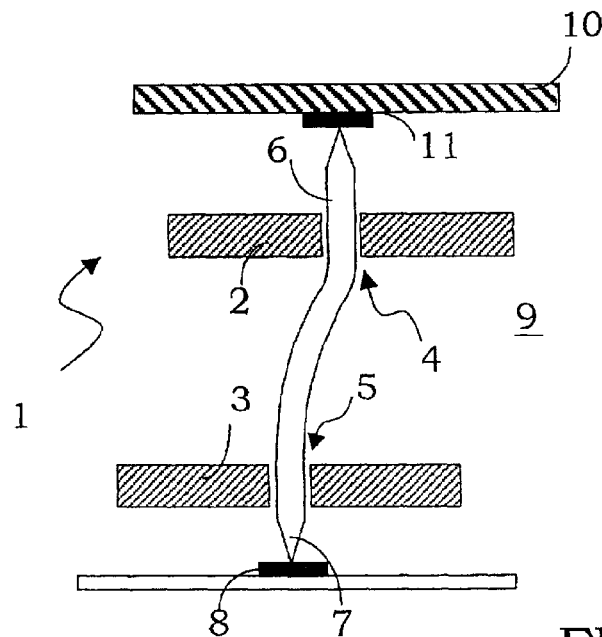
FIG. 1 is a cross-sectional view of a testing head according to an embodiment of the prior art.
Figure 2A:
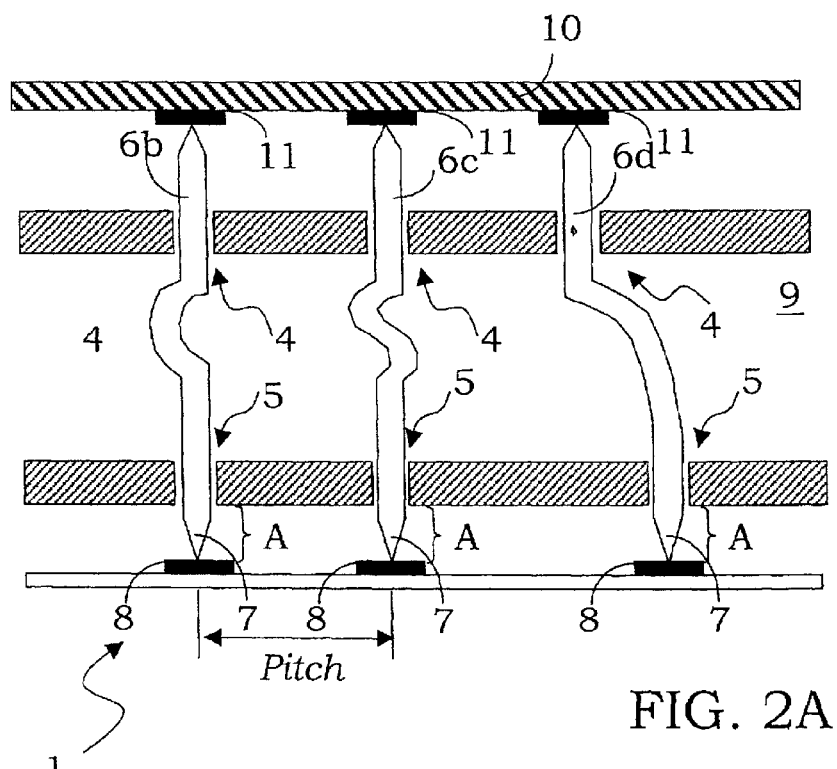
FIG. 2A is a cross-sectional view of a testing head according to another embodiments of the prior art.
Figure 2B:
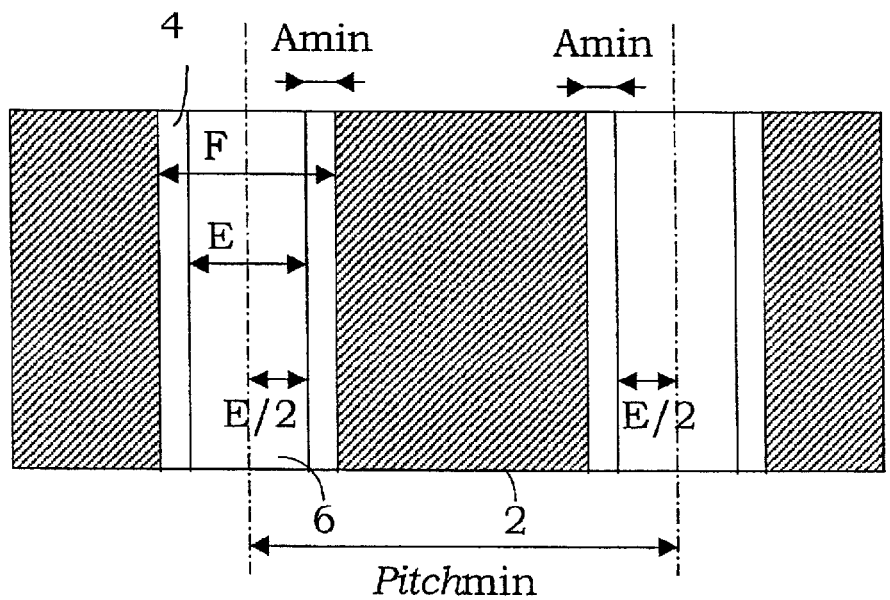
FIG. 2B is a cross-sectional view of a the testing head according to the embodiment of FIG. 1.
Figure 3:
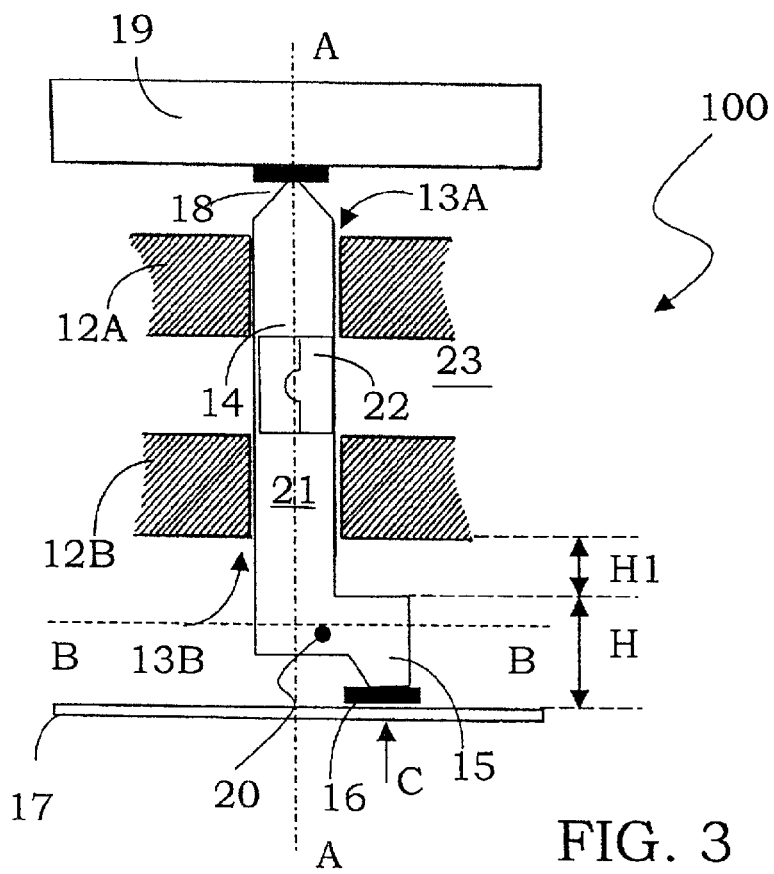
FIG. 3 is a cross-sectional view of a testing head according to an embodiment of the invention.
Figure 2C:
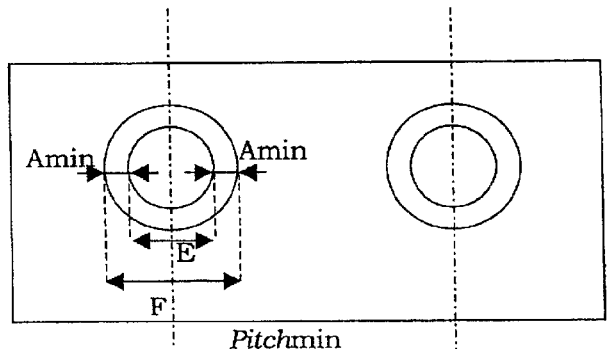
FIGS. 2C to 2F are top plan views of a testing head according to other embodiments of the prior art, comprising probes having different shapes.
Figure 2D:
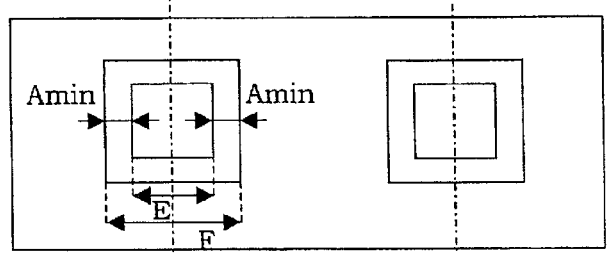
Figure 2E:
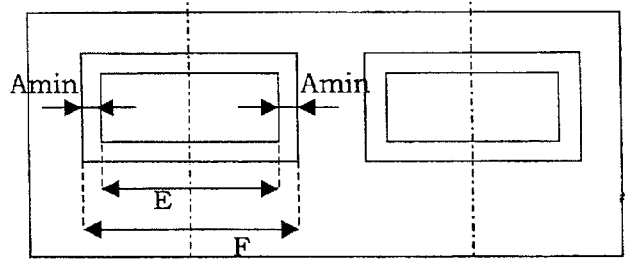
Figure 2F:
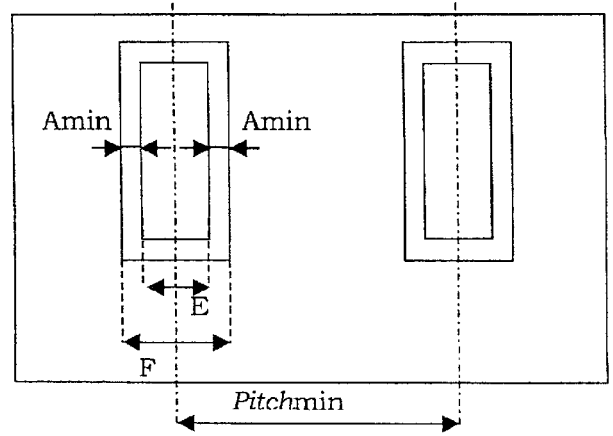

With reference to FIG. 3, a testing head according to an embodiment of the invention, designed for contacting an electronic integrated device to be tested, is shown generally at 100 in schematic form.

For simplicity, only the testing head portion that comprises two plate-like holders or dies for the movable contact probes is shown, it being understood that the testing head according to the embodiments of invention could accommodate a range of different dies and movable probes.

The testing head 100 has an upper die 12A and a lower die 12B, both formed with guide holes 13A, 13B, respectively, and adapted to receive a contact probe 14.

The contact probes 14 have contact tips 15 arranged to abut onto a plurality of contact pads 16 of an electronic integrated device, shown schematically at 17, to be tested.

In the embodiment of FIG. 3, the testing head 100 is shown to include loose-mounted probes that have a further contact tip 18 at another end for contacting a micro-contact strip or space transformer 19. This is given by way of non-limiting example of a testing head according to an embodiment of the invention. It should be understood, however, that the testing head 100 could be provided with fixed probes instead.

Advantageously according to an embodiment of the invention, each contact probe 14 is formed with a rigid arm 20, extending laterally from a body 21 of the probe 14. In particular, the rigid arm 20 extends along a perpendicular or otherwise sloping direction with respect to the probe 14, i.e. has a longitudinal axis B—B lying perpendicularly or at an angle to a longitudinal axis A—A of the contact probe 14. The arm 20 is terminated with the contact tip 15 of the probe 14 for abutting the contact pads 16 of the electronic integrated device 17 to be tested.

Accordingly, the point where the tip 15 of the probe 14 meets the pad 16 will be offset from the longitudinal axis A—A of the probe 14.

Advantageously according to an embodiment of the invention, the arm 20 is made rigid, and the probe 14 is designed to deform in a different region, called the deflection region 22, of its body 21.

In particular, H1 is the distance between the rigid arm 20 and the lower die 12B and corresponds to the maximum overtravel allowed to the probe 14, while H is the height of the rigid arm 20 extending laterally with respect to the body 21 of the probe 14.

Advantageously, as will be shown in a greater detail in the following description, the testing head 100 according to the embodiments of the invention allows a reduction in the minimum pitch value for the contact tips 15, thus allowing the testing of integrated electronic devices having contact pads with contact centers C really close, i.e. a really reduced pitch value.

By offsetting the contact tips 15 from the longitudinal axis A—A of the corresponding contact probes 14 and suitably orienting the probes, the contact probes 14 can be located in alternatively opposed positions with respect to the contact pads 16, thus increasing the area allowed for providing the guide holes.

Therefore, the minimum pitch distance between tips of adjacent probes can be reduced, as illustrated by the non-limitative examples of FIGS. 4A to 4F.

Figure 4A:
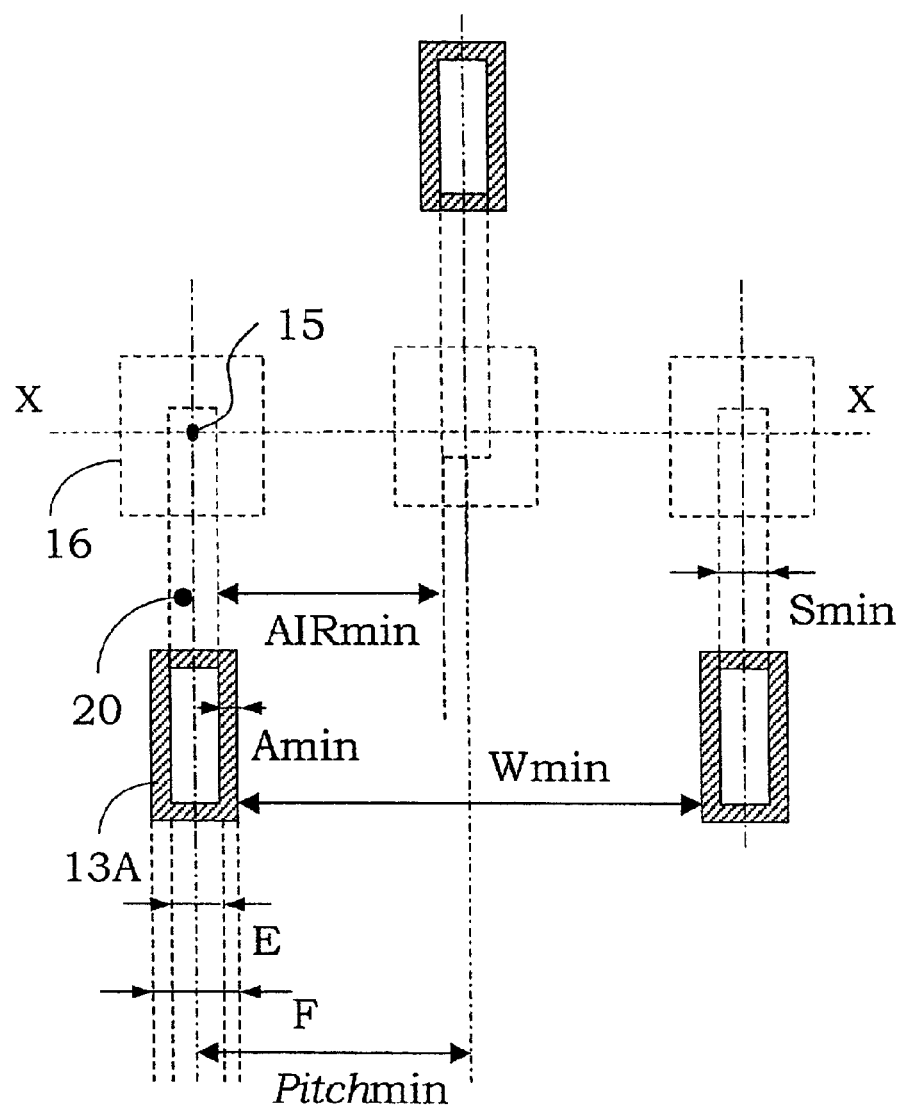
FIGS. 4A to 4F are top plan views of some layouts for plural contact probes in the testing head according to the embodiment of FIG. 3.
Figure 4B:
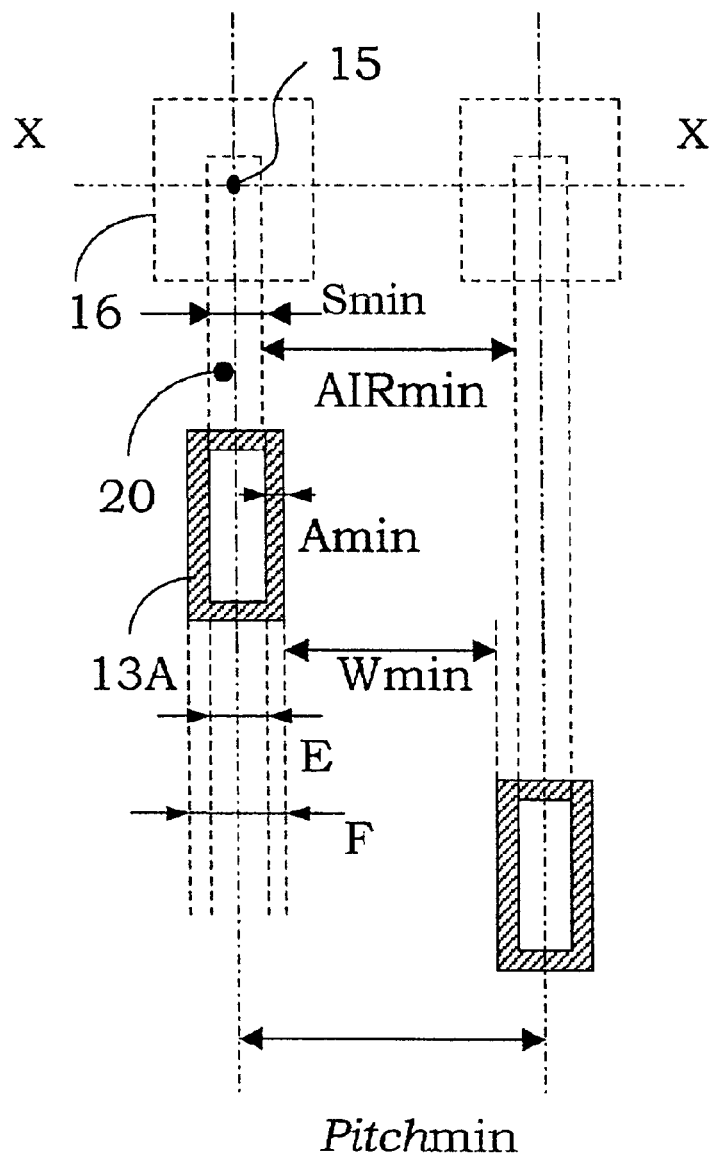
Figure 4C:
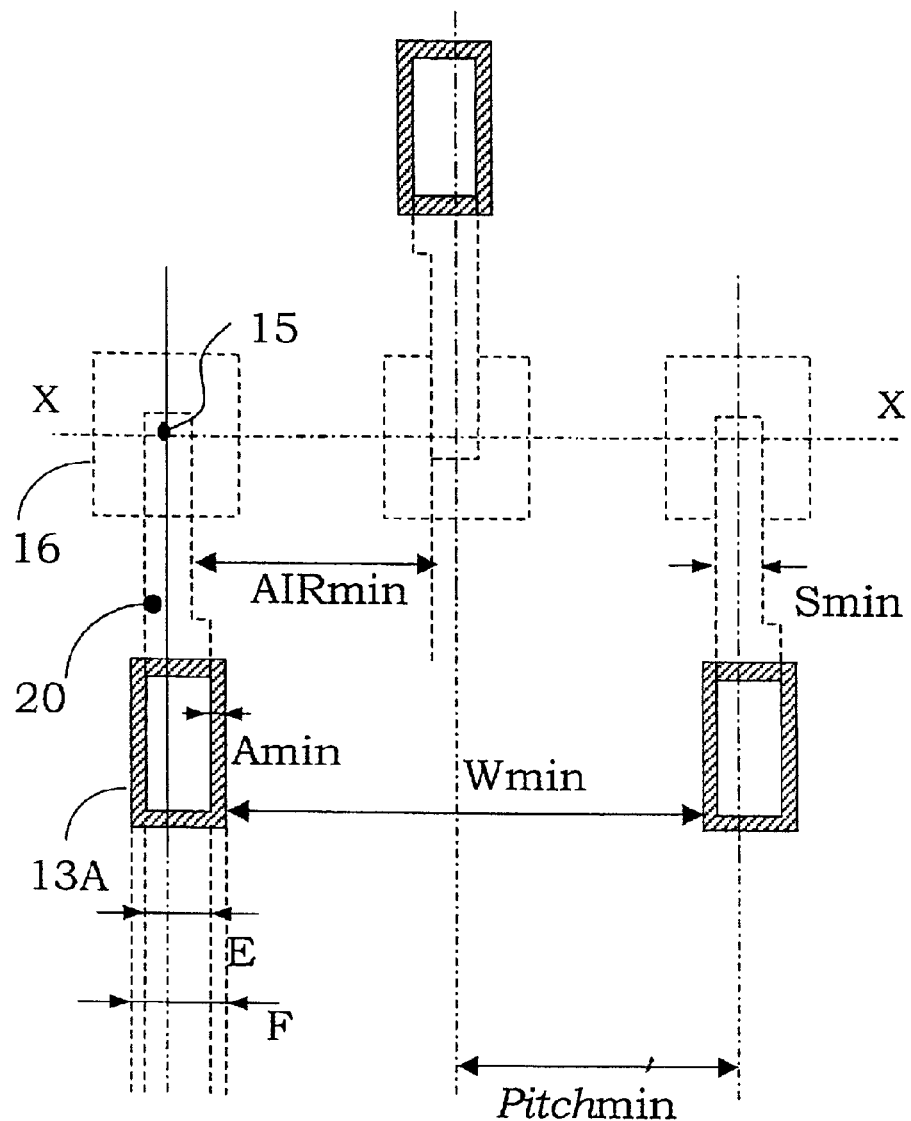
Figure 4D:
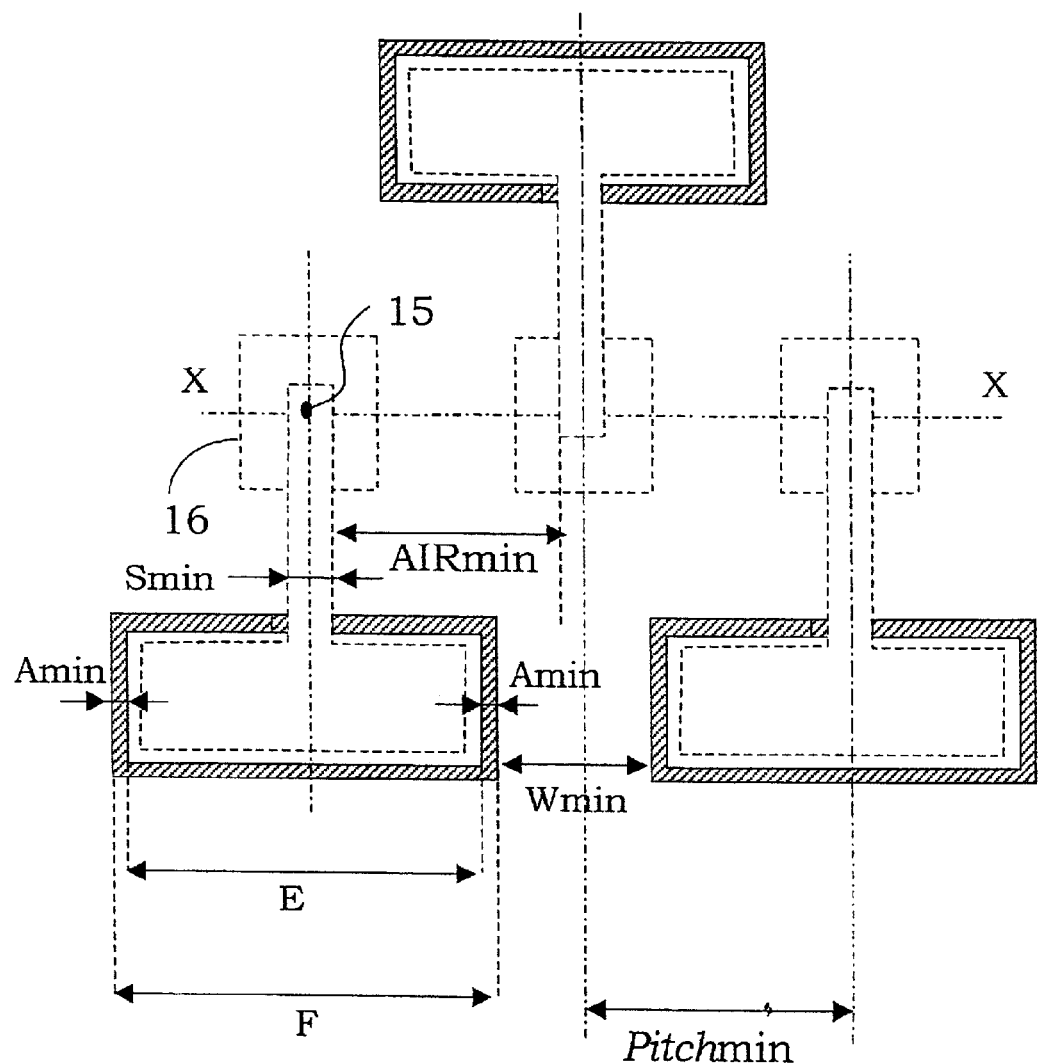

The minimum pitch value can be further reduced by using arms with different lengths, as shown schematically in FIG. 4B, and/or slenderizing the end portions of the arms 20, as shown schematically in FIGS. 4C and 4D.

It should be noted that FIG. 4D shows an arrangement for guide holes having a rectangular cross-section whose major side is parallel to the X—X axis of the contact pads, while in FIGS. 4A–4C such axes are perpendicular to each other.

Figure 4E:
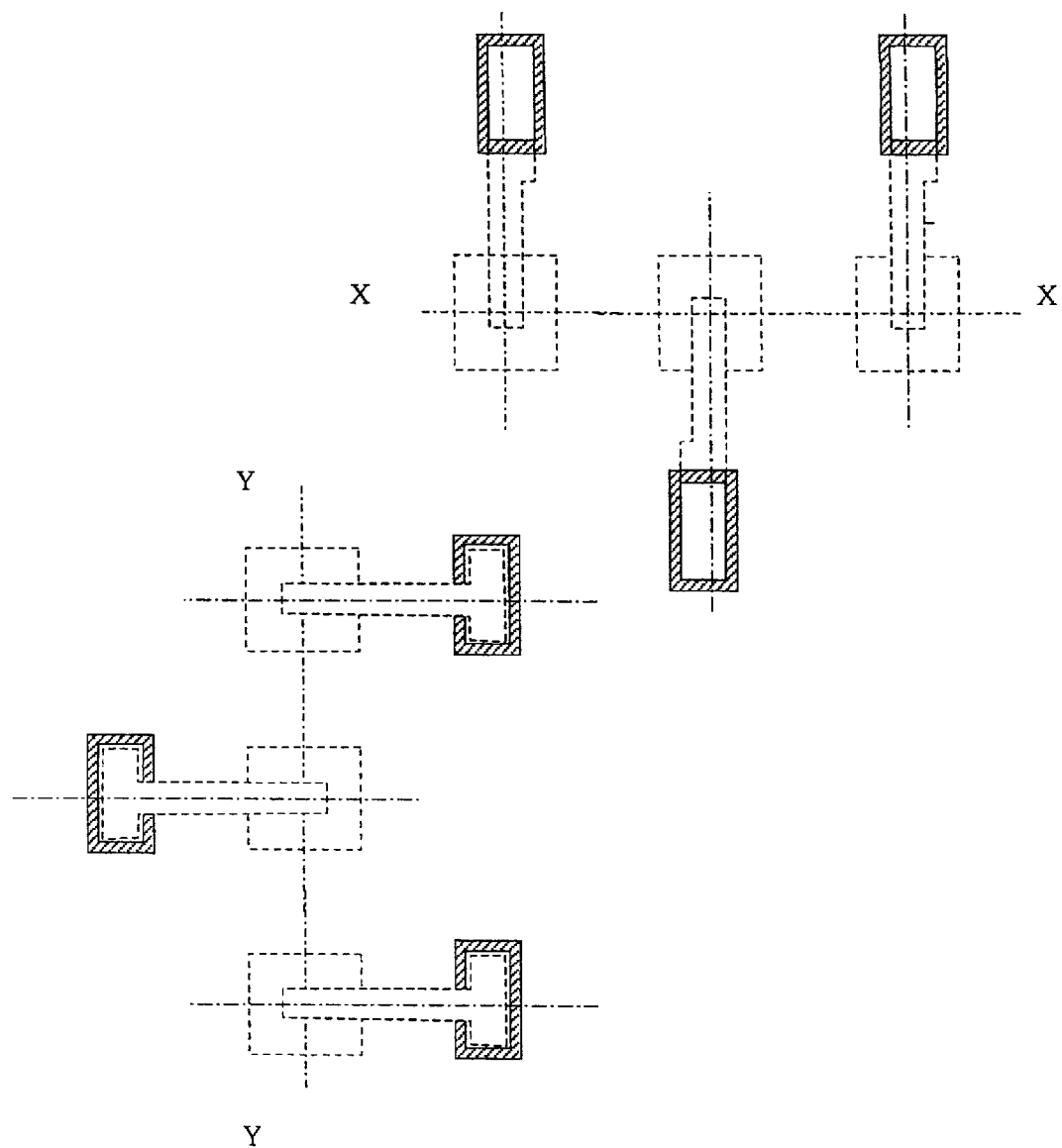

FIG. 4E shows a miscellaneous guide holes arrangement, to be used particularly when the contact pads are provided along all four sides of the chip to be tested.

Figure 4F:
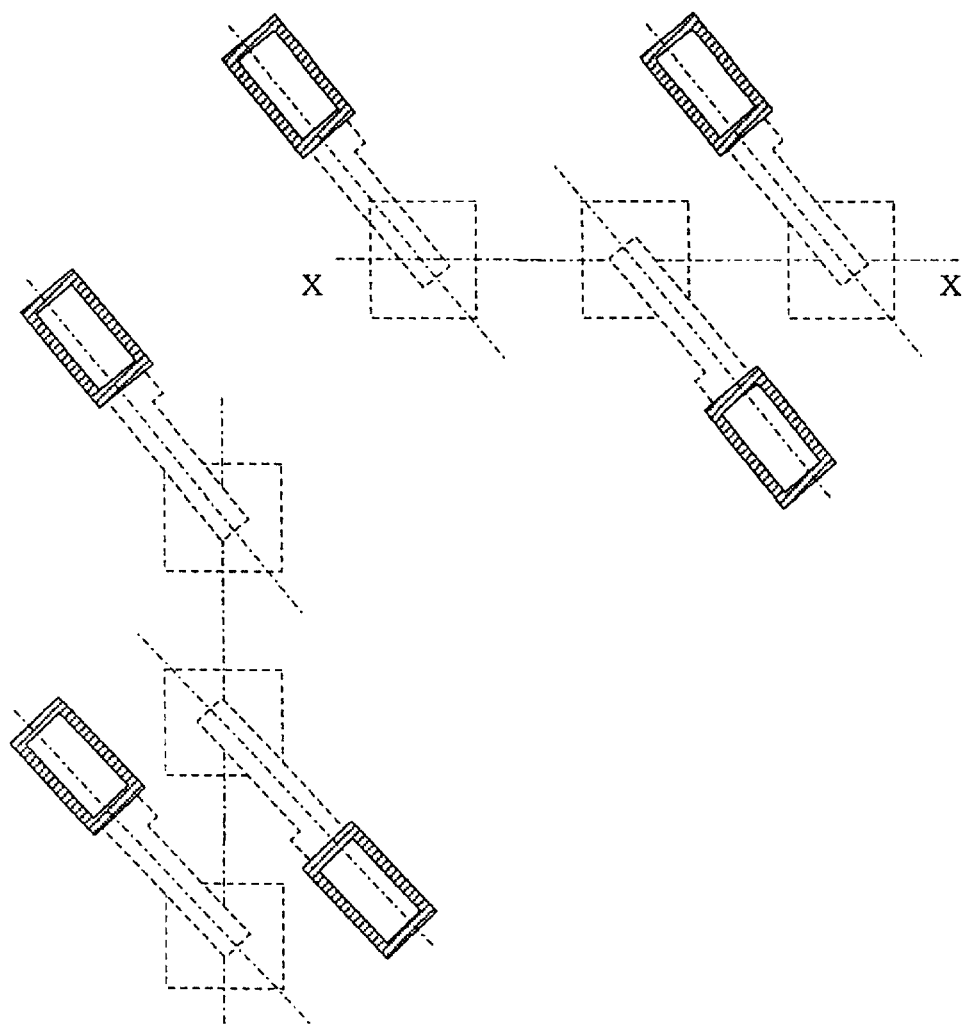

Finally, FIG. 4F shows a modified guide holes arrangement, to be used too when the contact pads are provided along all four sides of the chip to be tested.

In particular, the adjacent probes 14 are located in alternatively opposed positions with respect to the contact pads 16 and having a sloping symmetry axis with respect to the alignment axis Y—Y of the contact pads 16, such axis defining a predetermined angle, in a preferred embodiment equal to 45°.

Advantageously according to an embodiment of the invention, the value Pitchmin of minimum pitch is given as:

$$Pitchmin = S + AIRmin$$

where $S \leq E$ and, as shown schematically in FIGS. 4A to 4D:
 Pitchmin is the minimum pitch, i.e. the least distance between centers of two adjacent contact pads 16 of the electronic integrated device to be tested;
 S is the cross-section dimension of the tip 15 of the contact probe 14;
 AIRmin is the minimum distance between two adjacent arms; and
 E is the cross-section dimension of the contact probe 14.

In particular, FIGS. 4C and 4D show that the value of S can be made much smaller than E by suitably slenderizing a part of or the entire end portion of the arm 20.

From the above described examples, it can be noted that it is especially advantageous if the contact probes 14 have non-circular cross-sectional shapes. In a preferred embodiment of the invention, a probe 14 with a rectangular cross-section is provided by way of example. The corresponding guide holes 13A and 13B are here to also have a rectangular cross-sectional shape, so that the probes 14 passed through them are always oriented for proper engagement with the contact pads 16 on the electronic integrated device 17 to be tested.

Rectangular cross-section holes allow the probe spacing to be further reduced form circular ones, resulting in a still smaller value for the minimum pitch, as shown in FIGS. 4A to 4F.

In addition, the compressive deflection of a non-circular cross-section probe 14 in its deflection region 22, as the probe 14 is abutted against the electronic integrated device 17 to be tested, can be controlled much better because the deformation will take place in a given plane.

In this case, the probe orientation and precise positioning of the contact tip 15 on the contact pad 16 is ensured by the accurate orientation of the rectangular cross-section guide hole 13A preventing the probe 14 therein from turning.

The deflection region between the dies can be provided by any of the techniques commonly employed for vertical contact testing heads. As an example, the deflection region may be at least one air space between at least two dies that are either aligned or offset and have their guide holes formed with a straight or non-straight cross-sectional shape; in this region the probes may be straight, pre-bent, or have pre-deformed portions to encourage deflection upon contact.

Figure 5:
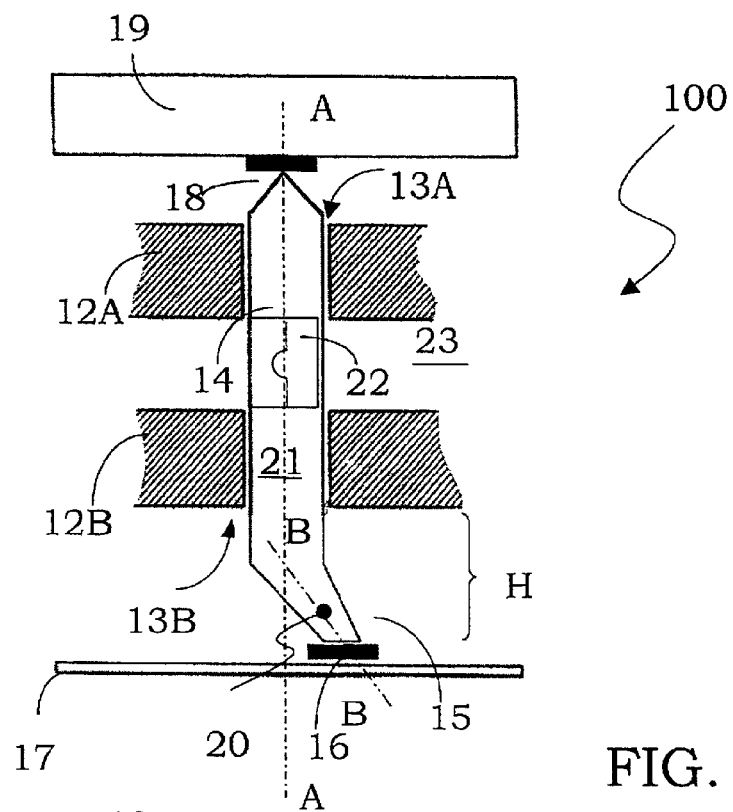
FIGS. 5 and 6 are cross-sectional views of a testing head according to further embodiments of the invention.

FIG. 5 shows a testing head 100 comprising a plurality of contact probes 14 having a rigid arm 20 with a slenderized shape and a sloping symmetry axis B-B with respect to the symmetry axis A—A of the body 21 of the probe 14.

In this Figure, H1 is the maximum overtravel allowed to the probe 14, while H is the height of the rigid arm 20 extending laterally with respect to the body 21 of the probe 14.

Figure 6:
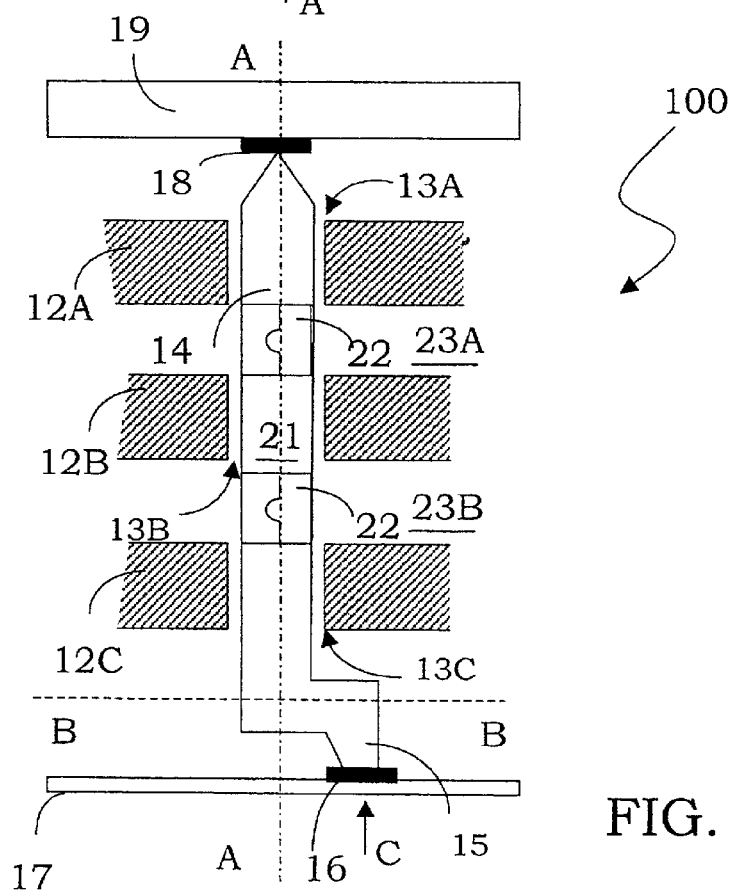

FIG. 6 shows by way of a non-limitative example a testing head 100 comprising three dies 12A, 12B and 12B defining a first 22A and a second deflection region 22B.

The testing head according to the embodiment of FIG. 6 allows to use contact probes 14 having a greater length than the testing heads according to the embodiments of FIGS. 3 and 5, thus facilitating the corresponding manufacturing process.

In a more general case, it is possible to define N deflection region using N+1 dies.

In such a case, it should be noted that the N+1 dies can be opportunely offset in order to facilitate and guide the deflection of the probes 14 in a particular direction within the respective deflection regions 22.

As a further example, where the testing head comprises loose-mounted probes, the risk of probes dropping out of the dies can be minimized by increasing the frictional drag of the contact probes 14 through the dies 12A and 12B.

For this purpose, the dies are offset a greater or lesser amount, such that their corresponding sets of guide holes are aligned together to a greater or lesser extent along normal directions to the dies.

It would be further possible to use dies provided with straight or non-straight guide holes, or even straight or pre-deformed contact probes.

Figure 7:
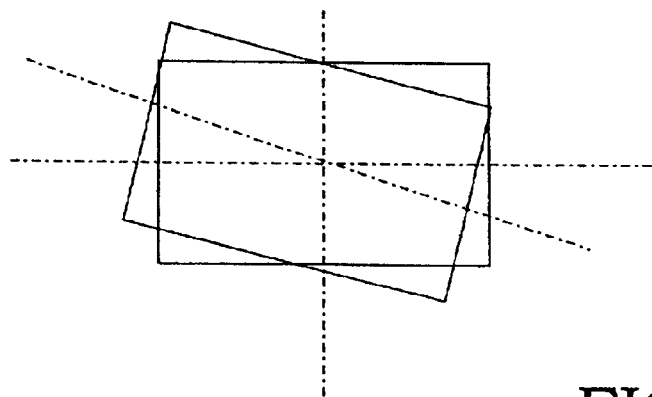
FIGS. 7 to 9 are top plan views of different arrangements contact probes-guide holes adapted to raise the frictional drag between them in a testing head according to other embodiments of the invention.

Advantageously according to further embodiments of the invention, the frictional drag of the probes 14 through the guide holes 13 is obtained by rotating the guide holes of at least one of the dies of a suitable angle, indicated as α in the example shown in FIG. 7, with respect to the corresponding guide holes provided in the other dies of the testing head.

Figure 8:
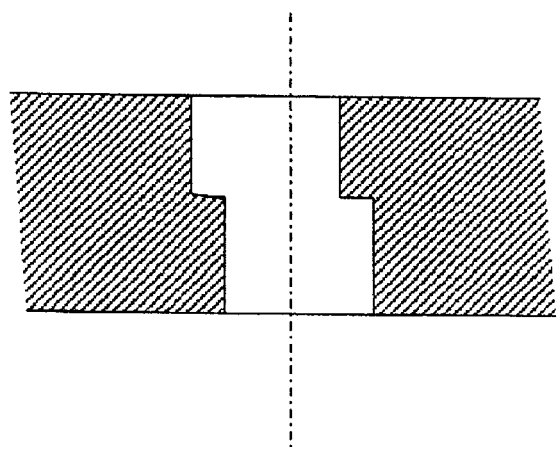

Alternatively, it is possible to made guide holes having slightly sloped axis in at least one of the dies, as shown in FIG. 8.

Figure 9:
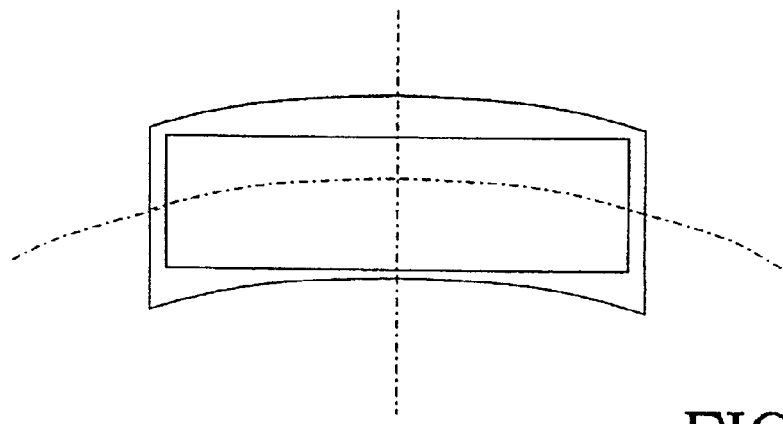

Finally, advantageously according to a further embodiment of the invention, an increased frictional drag of the probes 14 through the guide holes 13 is obtained by using guide holes having a suitable form in at least one of the dies, in order to elastically deform the contact probe, for example along its cross-sectional axis, as shown in FIG. 9.

Alternatively, it is possible to pre-deform the body 21 of the probes 14 along its cross-sectional or longitudinal axis.

Finally, in order to further reduce the risk of the contact probes dropping out of their guide holes, an elastic film may be applied to either die in any of the embodiments described hereinabove.

In conclusion, the testing head 100 according to the embodiments of the invention has, unlike vertical-probe testing heads according to the embodiments of the prior art, its contact probes 14 deformed substantially lengthwise and offset with their longitudinal axes from their contact points on the contact pads 16, thereby combining the advantages of both the vertical and horizontal technologies.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

We claim:

1. A testing head having vertical probes and comprising:
a top and a bottom plate-like holder provided with respective guide holes; and
a contact probe structured to be received in the guide holes and having a contact tip structured to establish mechanical and electrical contact to a corresponding contact pad of an integrated electronic device to be tested, the contact probe being deformed in a deflection region located between the top and bottom plate-like holders as the contact tip abuts onto the contact pad wherein the contact probe further comprises:
a body having a longitudinal axis extending through the bottom plate-like holder to an end portion below the bottom plate-like holder; and
a rigid arm extending transversely from the end portion of the body of the contact probe and terminating in the contact tip, the rigid arm being structured to offset the contact point of the contact probe with the corresponding contact pad with respect to the longitudinal axis of the body of the contact probe.

2. The testing head of claim 1, wherein the longitudinal axis of the rigid arm is non-perpendicular to the longitudinal axis of the contact probe.

3. The testing head of claim 1, wherein the contact tip has a sloping symmetry axis with respect to the longitudinal axis of the rigid arm.

4. The testing head of claim 1, further comprising contact probes having transversely extended rigid arms with different lengths.

5. The testing head of claim 1, wherein the rigid arm has a slenderized end portion.

6. The testing head of claim 1, wherein the contact probe has a circular cross-section shape.

7. The testing head of claim 1, wherein the contact probe has a non-circular cross-section shape.

8. The testing head of claim 1, wherein the contact probe has a rectangular cross-section shape.

9. The testing head of claim 1, further comprising an air space between the top and bottom plate-like holders, the air space allowing the deformation of the contact probe as the contact tip abuts on the contact pad.

10. The testing head of claim 1, further comprising a plurality of air spaces defined by a plurality of plate-like holders and allowing the contact probe to deform as the contact tip abuts against the contact pad.

11. The testing head of claim 10, wherein the plate-like holders comprise corresponding guide holes aligned along normal directions to the plate-like holders.

12. The testing head of claim 10, wherein the plate-like holders comprise corresponding guide holes not aligned along normal directions to the plate-like holders.

13. The testing head of claim 1, wherein the guide holes have straight cross-sectional shapes.

14. The testing head of claim 1, wherein at least one of the guide holes has a non-straight cross-sectional shape.

15. The testing head of claim 1, wherein the contact probe has a pre-deformed portion within an air space provided between the top and bottom plate-like holders.

16. The testing head of claim 1, wherein the contact probe has a pre-deformed portion provided within the guide holes.

17. The testing head of claim 1, wherein the guide holes have a suitable form able to elastically deform the contact probes.

18. The testing head of claim 1, wherein the guide holes have a suitable form which differs from a cross-sectional shape of the contact probes in order to define respective contact points.

19. The testing head of claim 1, wherein an elastic film is placed over the plate-like holders for improving the retention of the contact probes in the guide holes.

20. The testing head of claim 1, wherein at least one of the plate-like holders comprises guide holes whose axis define a suitable angle with respect to the guide holes of at least another of the plate-like holders in such a way to generate a torsion of the contact probe thus increasing the frictional drag of the probes through the guide holes.

21. A testing head having vertical probes and comprising:
a top and a bottom plate-like holder provided with respective guide holes; and
a contact probe structured to be received in the guide holes and having a contact tip structured to establish mechanical and electrical contact to a corresponding contact pad of an integrated electronic device to be tested, the contact probe being deformed in a deflection region located between the plate-like holders as the contact tip abuts onto the contact pad wherein the contact probe further comprises:
a body having a longitudinal axis extending through the bottom plate-like holder; and
a rigid arm extending from the body of the contact probe and terminating in the contact tip, the rigid arm being structured to offset the contact point of the contact probe with the corresponding contact pad with respect to the longitudinal axis of the contact probe, wherein a longitudinal axis of the rigid arm is substantially perpendicular to the longitudinal axis of the contact probe.

22. A testing head having vertical probes and comprising:
a top and a bottom plate-like holder provided with respective guide holes; and
a first contact probe and a second contact probe each structured to be received in the guide holes and each having a contact tip structured to establish mechanical and electrical contact to a corresponding contact pad of an integrated electronic device to be tested, each contact probe being deformed in a deflection region located between the top and bottom plate-like holders as their respective contact tips abut onto the respective contact pads wherein each contact probe further comprises:
a body having a longitudinal axis extending through the bottom plate-like holder to an end portion below the bottom plate-like holder; and a rigid arm extending transversely from the end portion of the body of the contact probe and terminating in the contact tip, the rigid arm being structured to offset the contact point of the contact probe with the corresponding contact pad with respect to the longitudinal axis of the body of the contact probe, wherein the rigid arm of the first contact probe extending in an opposite direction with respect to the rigid arm of the second contact probe.

23. The testing head of claim 22, wherein adjacent contact probes have a sloping symmetry axis with respect to an alignment axis of the contact pads.

24. A testing head having vertical probes and comprising:
a top and a bottom plate-like holder provided with respective guide holes;
a first contact probe and a second contact probe each having a sloping symmetry axis with respect to an alignment axis of corresponding contact pads; and
the first contact probe and the second contact probe each structured to be received in the guide holes and each having a contact tip structured to establish mechanical and electrical contact to a corresponding contact pad of an integrated electronic device to be tested, each contact probe being deformed in a deflection region located between the plate-like holders as their respective contact tip abuts onto the respective contact pad wherein each contact probe further comprises:
a body having a longitudinal axis extending through the bottom plate-like holder; and
a rigid arm extending laterally from the body of each contact probe and terminating in the contact tip, the rigid arm being structured to offset the contact point of each contact probe with the corresponding contact pad with respect to the longitudinal axis of the same contact probe, wherein the symmetry axis of the contact probes and the alignment axis of corresponding contact pads define an angle equal to 45°.

25. A testing head having vertical probes and comprising:
a top plate-like holder and a bottom plate-like holder and at least one additional plate-like holder between the top and bottom plate-like holders, each provided with respective guide holes; and
a plurality of contact probes held within the guide holes of the plate-like holders and formed with respective contact tips arranged to mechanically and electrically contact a plurality of contact pads of at least one integrated electronic device to be tested, wherein each contact probe further comprises:
a body having a first region between the top and bottom plate-like holders, a second region below the bottom plate-like holder and a longitudinal axis extending at least through the first region; and
a rigid arm in the second region extending transversely from the longitudinal axis of the body of the contact probe and terminating in the contact tip, the rigid arm being structured to offset the contact point of the contact probe with the corresponding contact pad with respect to the longitudinal axis of the body of the contact probe.

26. The testing head of 25, wherein the longitudinal axis of the rigid arms are non-perpendicular to the longitudinal axis of the contact probes.

27. The testing head of claim 25, wherein the contact tips have sloping symmetry axis with respect to a longitudinal axis of the rigid arms.

28. The testing head of claim 25, wherein the rigid arms have different lengths.

29. The testing head of claim 25, wherein the rigid arms have slenderized end portions.

30. The testing head of claim 25, wherein the contact probes have circular cross-section shapes.

31. The testing head of claim 25, wherein the contact probes have non-circular cross-section shapes.

32. The testing head of claim 25, wherein the contact probes have rectangular cross-section shapes.

33. The testing head of claim 25, further comprising an air space between the top and bottom plate-like holders, the air space allowing the deformation of the first region of the contact probes as the contact tips abut on the contact pads.

34. The testing head of claim 25, further comprising a plurality of air spaces defined by the plurality of plate-like holders and allowing the first region of the contact probes to deform as the contact tips abut against the contact pads.

35. The testing head of claim 34, wherein the guide holes of the plate-like holders are aligned along a normal direction to the plate-like holders.

36. The testing head of claim 34, wherein the guide holes of the plate-like holders are not aligned along a normal direction to the plate-like holders.

37. The testing head of claim 25, wherein the guide holes have straight cross-sectional shapes.

38. The testing head of claim 25, wherein at least one of the guide holes has a non-straight cross-sectional shape.

39. The testing head of claim 25, wherein the contact probes have pre-deformed portions of their first regions within an air space provided between the plate-like holders.

40. The testing head of claim 25, wherein the contact probes have pre-deformed portions of their first regions provided within the guide holes.

41. The testing head of claim 25, wherein the guide holes have a suitable form able to elastically deform the first region of the contact probes.

42. The testing head of claim 25, wherein the guide holes have a suitable form which differs from a cross-sectional shape of the contact probes in order to define respective contact points.

43. The testing head of claim 25, wherein an elastic film is placed over the plate-like holders for improving the retention of the contact probes in the guide holes.

44. The testing head of claim 25, wherein at least one of the plate-like holders comprises guide holes whose axis define a suitable angle with respect to the guide holes of at least another of the plate-like holders in such a way to generate a torsion of the contact probes thus increasing the frictional drag of the probes through the guide holes.

45. A testing head having vertical probes and comprising:
a top plate-like holder and a bottom plate-like holder and at least one additional plate-like holder between the top and bottom plate-like holders, each provided with respective guide holes; and
a plurality of contact probes held within the guide holes of the plate-like holders and formed with respective contact tips arranged to mechanically and electrically contact a plurality of contact pads of at least one integrated electronic device to be tested, wherein each contact probe further comprises:
a body having a first region between the top and bottom plate-like holders, a second region below the bottom plate-like holder and a longitudinal axis extending at least through the first region; and
a rigid arm in the second region extending from the longitudinal axis of the body of the contact probe and terminating in the contact tip, the rigid arm being structured to offset the contact point of the contact probe with the corresponding contact pad with respect to the longitudinal axis of the body of the contact probe, wherein a longitudinal axis of the rigid arm is substantially perpendicular to the longitudinal axis of the corresponding contact probe.

46. A testing head having vertical probes and comprising:

a top plate-like holder and a bottom plate-like holder and at least one additional plate-like holder between the top and bottom plate-like holders, each provided with respective guide holes; and a plurality of contact probes held within the guide holes of the plate-like holders and formed with respective contact tips arranged to mechanically and electrically contact a plurality of contact pads of at least one integrated electronic device to be tested, wherein each contact probe further comprises:

a body having a first region between the top and bottom plate-like holders, a second region below the bottom plate-like holder and a longitudinal axis extending at least through the first region; and a rigid arm in the second region extending transversely from the longitudinal axis of the body of the contact probe and terminating in the contact tip, the rigid arm being structured to offset the contact point of the contact probe with the corresponding contact pad with respect to the longitudinal axis of the body of the contact probe, wherein rigid arms of adjacent contact probes extend in opposite directions with respect to each other.

47. The testing head of claim 46, wherein adjacent contact probes have a sloping symmetry axis with respect to an alignment axis of the contact pads.

48. A testing head having vertical probes and comprising:

a top plate-like holder and a bottom plate-like holder and at least one additional plate-like holder between the top and bottom plate-like holders, each provided with respective guide holes; and a plurality of contact probes held within the guide holes of the plate-like holders and formed with respective contact tips arranged to mechanically and electrically contact a plurality of contact pads of at least one integrated electronic device to be tested, wherein each contact probe further comprises:

a body having a first region between the top and bottom plate-like holders, a second region below the bottom plate-like holder and a longitudinal axis extending at least through the first region;

a rigid arm extending laterally from the body of each contact probe and terminating in the contact tip, the rigid arm being structured to offset the contact point of each contact probe with the corresponding contact pad with respect to the longitudinal axis of the same contact probe; and adjacent contact probes having a sloping symmetry axis with respect to an alignment axis of corresponding contact pads, wherein the symmetry axis of the contact probes and the alignment axis of the contact pads define an angle equal to 45°.

* * * * *